United States Patent
Durand et al.

(10) Patent No.: US 10,001,194 B2
(45) Date of Patent: Jun. 19, 2018

(54) DEVICE FOR DRIVING IN ROTATION A TOOTHED WHEEL, IN PARTICULAR A TURNTABLE

(71) Applicant: MICRO CONTROLE—SPECTRA PHYSICS, Evry (FR)

(72) Inventors: Eric Durand, Amilly (FR); Bruno Rety, Bouzy la Foret (FR)

(73) Assignee: Micro Controle-Spectra Physics, Evry (FR)

( * ) Notice: Subject to any disclaimer, the term of this patent is extended or adjusted under 35 U.S.C. 154(b) by 134 days.

(21) Appl. No.: 14/162,100

(22) Filed: Jan. 23, 2014

(65) Prior Publication Data
US 2014/0202274 A1    Jul. 24, 2014

(30) Foreign Application Priority Data
Jan. 24, 2013 (FR) .................................. 13 50622

(51) Int. Cl.
| | |
|---|---|
| *F16H 1/16* | (2006.01) |
| *F16H 37/02* | (2006.01) |
| *F16H 57/021* | (2012.01) |
| *F16H 57/022* | (2012.01) |
| *F16H 57/12* | (2006.01) |
| *G01R 31/28* | (2006.01) |
| *F16H 7/02* | (2006.01) |

(52) U.S. Cl.
CPC .............. *F16H 1/16* (2013.01); *F16H 37/02* (2013.01); *F16H 7/02* (2013.01); *F16H 2057/0213* (2013.01); *F16H 2057/0222* (2013.01); *F16H 2057/127* (2013.01); *G01R 31/2887* (2013.01); *Y10T 74/19828* (2015.01)

(58) Field of Classification Search
CPC ......................................................... F16H 1/26
USPC .................................................... 74/425, 352
See application file for complete search history.

(56) References Cited

U.S. PATENT DOCUMENTS

| | | | | |
|---|---|---|---|---|
| 4,040,307 A | * | 8/1977 | Koster | ...................... F16H 1/16 74/425 |
| 4,827,790 A | * | 5/1989 | Bisiach | ...................... F16H 1/16 74/398 |
| 5,475,930 A | * | 12/1995 | Kimura | ...................... F16H 1/16 33/290 |

(Continued)

FOREIGN PATENT DOCUMENTS

| | | |
|---|---|---|
| DE | 38 04 861 | 8/1989 |
| GB | 235184 | 2/1926 |
| JP | 2011-210956 | 10/2011 |

OTHER PUBLICATIONS

French Preliminary Search Report dated Jul. 1, 2013 and English Translation.

*Primary Examiner* — Terence Boes
*Assistant Examiner* — Randell J Krug
(74) *Attorney, Agent, or Firm* — Dickinson Wright, PLLC

(57) ABSTRACT

A driving device for driving in rotation a toothed wheel, in particular a turntable, has a worm intended to mesh with the toothed wheel, a motor to drive the worm in rotation, a flexible sleeve that partially surrounds the worm in such a way as to form an assembly described as a worm/sleeve assembly, and a pre-stressing unit. The motor is arranged in a structure that is fitted pivotably relative to the worm/sleeve assembly, and the driving device also has a force transfer unit connecting the motor to the sleeve at a second extremity of the worm.

8 Claims, 2 Drawing Sheets

(56) References Cited

U.S. PATENT DOCUMENTS

| | | | | |
|---|---|---|---|---|
| 7,721,616 B2* | 5/2010 | Augustine | ................ | F16H 1/16 |
| | | | | 74/352 |
| 8,336,412 B1* | 12/2012 | Ishii | .................... | B62D 5/0409 |
| | | | | 180/444 |
| 2004/0231445 A1* | 11/2004 | Marcus | ................... | F16H 55/24 |
| | | | | 74/425 |

* cited by examiner

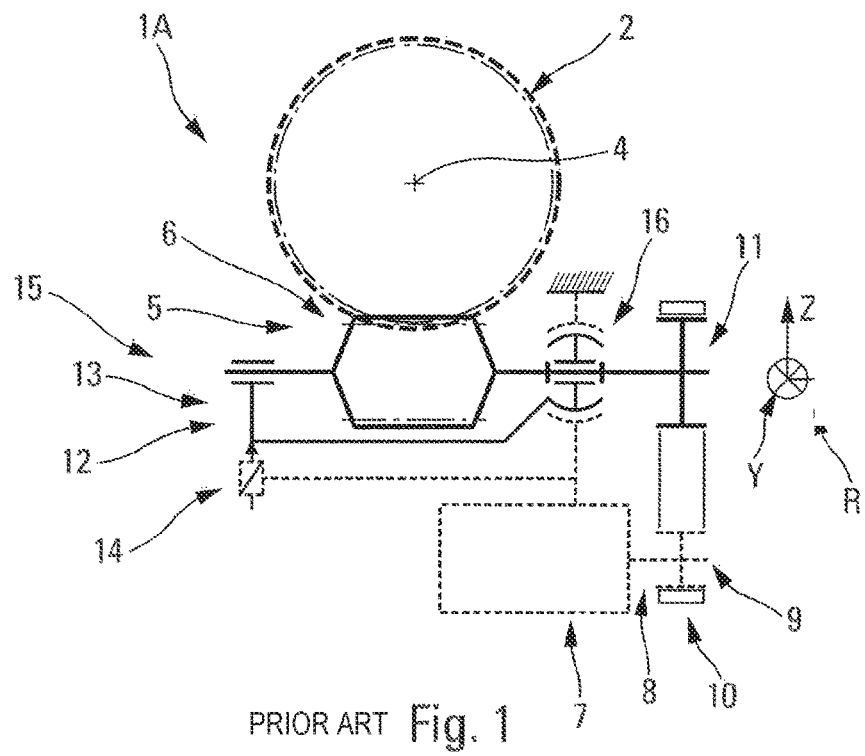
PRIOR ART Fig. 1
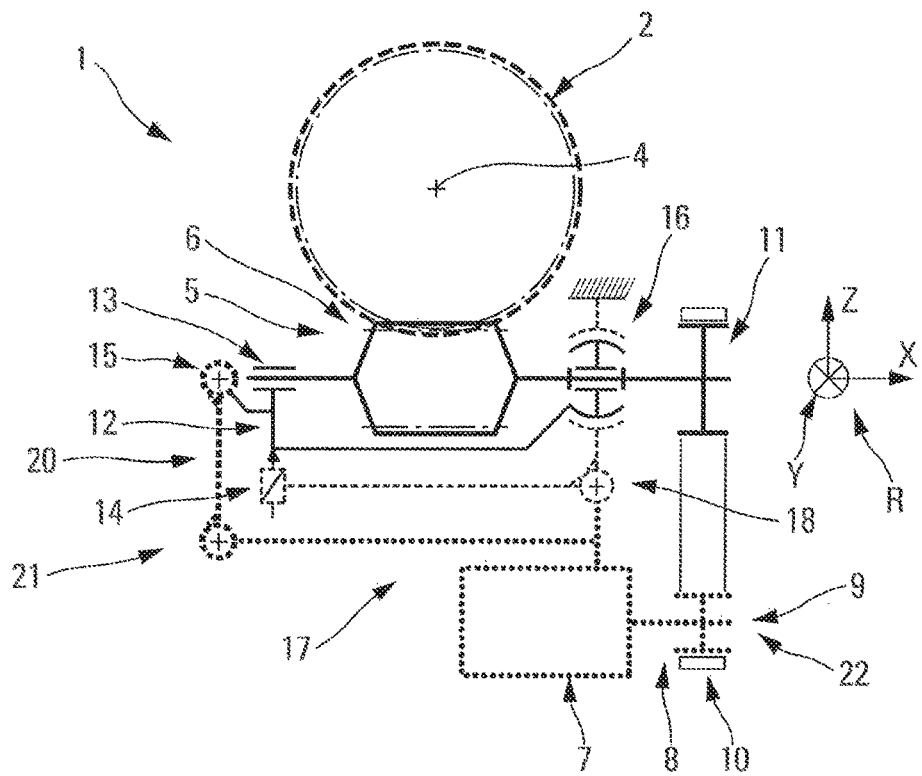
Fig. 2

DEVICE FOR DRIVING IN ROTATION A TOOTHED WHEEL, IN PARTICULAR A TURNTABLE

CROSS REFERENCE TO RELATED APPLICATION(S)

This application is based on French Application No. 1350622 filed Jan. 24, 2013, the entire contents of is incorporated by reference herein.

FIELD

The present invention relates to a device for driving in rotation a toothed wheel, in particular a turntable.

BACKGROUND

More particularly, although not exclusively, the present invention is applicable to a turntable or rotary plate that is intended for precision positioning applications (such as inspection of semiconductor wafers, metrology, positioning of components, and microrobotics) in different fields, including research, industry, and defence.

Generally, a device of this kind for driving in rotation a toothed wheel usually includes the following:
- a worm that is designed to mesh with said toothed wheel; and
- a motor, a drive shaft of which is connected, via a belt, to a first extremity of said worm in order to drive the worm in rotation. In addition, this motor is fixed relative to said worm.

Furthermore, in particular to make it easier to position the worm in mesh with the toothed wheel, this device for driving in rotation can also include:
- a flexible sleeve that surrounds the worm; and
- a pre-stressing means that can be adjusted by an operator and that enables pressure to be exerted on the sleeve at a second extremity of the worm opposite said first extremity, the purpose being to apply the worm appropriately against the toothed wheel.

However, the pressure exerted on the flexible sleeve by this prestressing means is disrupted by the belt tension being exerted at the other extremity in such a way that the prestressing means cannot perform its function effectively. This disruption can lead to difficulties in fitting and reduce the stability of positioning of the assembly during operation.

This standard drive device is therefore not completely satisfactory.

SUMMARY OF THE PRESENT INVENTION

The aim of the present invention is to remedy these disadvantages. The invention relates to a device for driving in rotation a toothed wheel, enabling, in particular, the pre-stressing means to perform its function completely and effectively.

To that end, according to the invention, said device of the type including:
- a worm intended to mesh with said toothed wheel;
- a motor that is arranged parallel to said worm and of which a drive shaft arranged at a first extremity is connected, via a belt, to a first extremity of said worm in order to drive the worm in rotation;
- a flexible sleeve that partially surrounds said worm in such a way as to form an assembly described as a worm/sleeve assembly; and
- adjustable pre-stressing means enabling pressure to be exerted on the worm/sleeve assembly at a second extremity of the worm opposite said first extremity;

is noteworthy in that:
- said motor is arranged in a structure that is fitted pivotably relative to the worm/sleeve assembly; and
- said device also has a force transfer means that is arranged so as to connect a second extremity of the motor, opposite said first extremity, to said sleeve at said second extremity of the worm.

Thus, by virtue of the invention, the belt tension and the wheel/worm prestressing means are uncoupled. The motor is no longer fixed relative to the worm/sleeve assembly, but is fitted to a structure that pivots relative to that assembly. The extremity of this structure (opposite the extremity that includes the belt) is connected to the flexible sleeve via force transfer means. Thus, when the belt (connecting the structure (comprising the motor) at a first extremity to the worm/sleeve assembly) is tightened, the force is transferred to the other extremity by the force transfer means (also connecting the structure (comprising the motor) to the worm/sleeve assembly at this other extremity) and thus no longer disrupts the wheel/worm mechanism for applying force.

Consequently, the pre-stressing means can perform its function effectively. This facilitates fitting and increases the stability of positioning of the different elements of the device during operation.

Within the scope of the present invention, the force transfer means can be produced in different ways. In particular, said force transfer means can, advantageously, comprise:
- a flexible contact; or
- a connecting rod.

As the worm/sleeve assembly is able to pivot around an axis, advantageously, the axis of pivot of the pivoting structure is parallel to the axis of pivot of this worm/sleeve assembly, and these two axes of pivot are arranged in a plane that is approximately orthogonal to the (longitudinal) axis of the worm.

Furthermore, advantageously, a traversing space is arranged at the second extremity of the motor to allow easier access to the pre-stressing means.

The present invention thus makes it possible to improve the power transmission linkage of a toothed wheel, in particular of a turntable.

The present invention also relates to a system for producing a rotary movement, comprising a toothed wheel meshed with a worm forming part of drive means. According to the invention, said drive means includes a drive device of the type mentioned above.

The present invention also relates to a motorised turntable or rotary plate, which is provided with a toothed wheel producing the rotary movement of the turntable and with means for driving this toothed wheel in rotation, said means having a drive device as described above.

BRIEF DESCRIPTION OF THE DRAWINGS

The appended drawings will give a clear understanding as to how the invention can be realised. In these drawings, identical references designate similar elements.

FIG. 1 is a diagrammatic view of a standard drive device.

FIG. 2 is a diagrammatic view of a drive device according to the invention.

DETAILED DESCRIPTION

Figure 3:
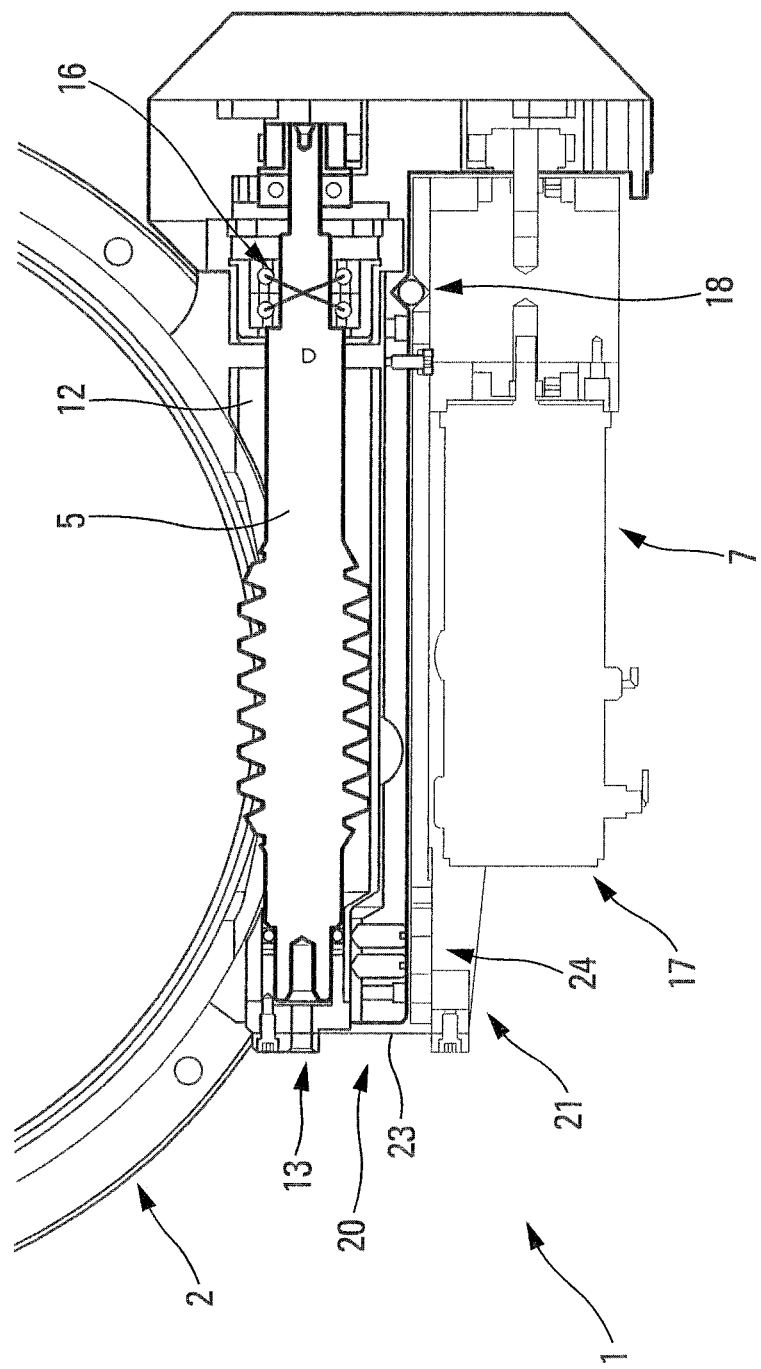
FIG. 3 is a view in cross-section of a particular embodiment of a drive device according to the invention.

The present invention relates to a device 1 for driving in rotation a toothed wheel (or pinion) 2, forming in particular part of a motorised turntable or rotary plate (not shown). This turntable can be intended, in particular, for precision positioning applications (inspection of semiconductor wafers, metrology, positioning of components, microrobotics, etc.) in different fields, including research, industry, and defence.

The toothed wheel 2 is driven in rotation around an axis 4 parallel to a direction Y (of a direction reference marker R).

A device for driving a toothed wheel in rotation, according to a standard embodiment 1A, has, as shown diagrammatically in FIG. 1, a worm 5 which is represented by a cylinder with a helical groove. This worm 5 is intended to mesh with the toothed wheel 2 at a zone 6, so that, in position, the longitudinal axis of the worm 5 is positioned at a tangent relative to the wheel 2 along a direction X.

Associated with this toothed wheel (or pinion) 2, the worm 5 thus enables the axis of rotation to be changed: while the worm 5 turns around its axis of direction X, the toothed wheel 2 turns around the axis 4 of direction Y perpendicular to X.

The drive device 1A also has an electric motor 7 of a standard type, which is fitted in a manner that is fixed relative to the worm 5 and which comprises at one extremity 8 a drive shaft 9 which is parallel to the axis of the worm 5 (along the direction X). In addition, the drive shaft 9 is connected, in the usual manner, via a belt 10, to an extremity 11 of said worm 5 in order to drive the worm in rotation, around the direction X, and thus drive said toothed wheel 2 in rotation around its axis 4.

In addition, the drive device 1A also has:
a flexible sleeve 12 which is, for example, made of metal in a single deformable piece, and which surrounds the worm 5, except at the zone of contact 6 between the worm and the toothed wheel 2 so as to form a worm/sleeve assembly 13; and
means for prestressing 14, in particular screws, which can be adjusted by an operator and which allow pressure to be exerted on the sleeve 12 (and thus on the assembly 13) at an extremity 15 of the worm opposite said extremity 11, the aim being to apply the worm 5 against the toothed wheel 6 along a direction Z (which is orthogonal to the directions X and Y) so as to give it the appropriate operational position. In order to do this, the worm/sleeve assembly 13 is fitted so that it can pivot around an axis of pivot 16 situated at the extremity 11 opposite the zone on which the pre-stressing means 14 acts.

Preferably, the flexible sleeve 12 is a single deformable metal part which holds the bearing 15 rigidly along Y while allowing it movement in translation along Z. The bearing 15 can also be fitted to a translation stage.

In this standard embodiment shown in FIG. 1, the position of the motor 7 of the device 1A is therefore fixed relative to the sleeve/worm assembly 13.

The last features make it possible, in particular, to facilitate the placing and precise positioning of the worm 5 in mesh with the toothed wheel 2.

However, in this standard embodiment 1A, the pressure exerted on the flexible sleeve 12 by the pre-stressing means 14 is disrupted by the tension of the belt 10 in such a way that the pre-stressing means 14 cannot perform its function effectively. This disruption can lead to difficulties in fitting and reduce the stability of positioning of the assembly during operation.

The device 1 according to the invention shown diagrammatically in FIG. 2 enables the disadvantages described above to be overcome.

This device 1 has the same elements 1 to 16 as those described above in relation to the standard device 1A, with the exception of the features specified below. These similar elements are therefore not described a second time in the description that follows.

According to the invention, to overcome the disadvantages specified above, the device 1 according to the invention and shown in FIGS. 2 and 3 has the following particular features (which are different from those of the standard device 1A).

The motor 7 forms part of a structure 17 that is fitted pivotably relative to the worm/sleeve assembly 13, being able to pivot around an axis 18. The axis of pivot 18 of said pivoting structure 17 is parallel to the axis of pivot 16 of the worm/sleeve assembly 13, these axes 16, 18 being arranged along the direction Y. In addition, these two axes 16 and 18 define a plane that is approximately orthogonal to the axis (of direction X) of the worm 5.

Furthermore, said device 1 also has force transfer means 20 fixed:
firstly, to the extremity 21 of the structure 17 (comprising the motor 5), opposite the extremity 22 to which the drive shaft 9 is fitted; and
secondly, to said sleeve 12 at the extremity 15 of the worm 5, so as to connect the extremity 21 of the motor 7 to the extremity 15 of the sleeve/worm assembly 13.

By virtue of these features according to the invention, on the device 1 the tension of the belt 10 and the wheel/worm pre-stressing means 14 are uncoupled. The motor 7 is therefore no longer fixed relative to the worm/sleeve assembly 13 (as in the standard embodiment 1A), but it is fitted to a structure 17 that can pivot relative to this assembly 13. The extremity 21 of this structure 17 is connected to the flexible sleeve 12 by force transfer means 20.

Thus, when the belt 10 (connecting the structure 17 to the assembly 13 at the extremity 11, 22) is tightened, the force is transferred to the other extremity 15, 21 by the force transfer means 20 (also connecting the structure 17 to the assembly 13 at this other extremity 15, 21) and no longer disrupts the wheel/worm mechanism for application of force.

Consequently, the pre-stressing means 14 is able to perform its function effectively. This facilitates the fitting of the worm 5 relative to the toothed wheel 2 and increases the stability of positioning of the assembly during operation.

Within the scope of the present invention, the force transfer means 20 can be produced in different ways. In particular, said force transfer means can comprise a flexible contact 23, as shown in FIG. 3. This force transfer means 20 can also comprise a connecting rod or any other appropriate mechanical means.

Furthermore, a traversing space 24 is arranged at the extremity 21 of the structure 17 to allow an operator to access the pre-stressing means 14, in particular by using a screwdriver, so that the operator can adjust the appropriate pressure produced by this pre-stressing means 14 in order to apply the worm 5 against the toothed wheel.

The present invention thus makes it possible to improve the power transmission linkage of a toothed wheel 2, forming part of a motorised turntable.

The invention claimed is:

1. A device for driving in rotation a toothed wheel, said device having:
   a worm that meshes with said toothed wheel;
   a motor disposed parallel to said worm and having a drive shaft arranged at a first extremity of the motor;
   a belt which connects said drive shaft to a first extremity of said worm in order to drive the worm in rotation;
   a flexible sleeve that partially surrounds said worm to form a worm/sleeve assembly;
   an adjustable wheel/worm pre-stressing screw that applies pressure on the worm/sleeve assembly at a second extremity of the worm opposite said first extremity to apply said worm against the toothed wheel in a direction substantially perpendicular to an axis of said drive shaft of said motor;
   a pivotable structure that is fitted pivotably at a pivot axis relative to the worm/sleeve assembly, said motor being disposed in said pivotable structure to be pivotable with respect to the worm/sleeve assembly and the adjustable wheel/worm pre-stressing screw about said pivot axis; and
   a force transfer contact element that connects a second extremity of the motor, opposite said first extremity, to said sleeve at said second extremity of the worm, the second extremity of the motor being connected to the flexible sleeve by the force transfer contact element.

2. The device according to claim 1, characterised in that said contact is a flexible contact.

3. The device according to claim 1, characterised in that said contact comprises a connecting rod.

4. The device according to claim 1, characterised in that as the worm/sleeve assembly is able to pivot around an axis, an axis of pivot of said pivoting structure is parallel to the axis of pivot of this worm/sleeve assembly, and in that these axes of pivot are arranged in a plane that is approximately orthogonal to an axis (X) of the worm.

5. The device according to claim 1, characterised in that a traversing space is arranged at the second extremity of the motor to allow access to the pre-stressing screw.

6. A system for producing a rotary movement comprising a toothed wheel meshed with a worm forming part of a drive assembly, characterized in that said drive assembly includes a device as in claim 1.

7. A motorised turntable, provided with a toothed wheel producing a rotary movement of the turntable and with assembly for driving this toothed wheel in rotation, characterised in that said drive assembly has a device as in claim 1.

8. The device according to claim 1, wherein:
   the pivotable structure, by enabling pivoting of the motor relative to the worm/sleeve assembly and the adjustable wheel/worm pre-stressing screw about said pivot axis, enables tension of the belt and the pressure of the wheel/worm pre-stressing screw to be uncoupled relative to one another such that when tension applied to the belt connecting said pivotable structure to the worm/sleeve assembly at the first extremity of the worm is tightened, a force is transferred to the second extremity of the worm and the second extremity of the motor by the force transfer contact element without disrupting application of pressure on the worm/sleeve assembly by said pre-stressing screw.

* * * * *